(12) United States Patent
Fernandez

(10) Patent No.: US 7,564,315 B2
(45) Date of Patent: Jul. 21, 2009

(54) SYSTEM AND METHOD FOR PRE-CHARGED LINEAR PHASE-FREQUENCY DETECTOR

(75) Inventor: Francisco Fernandez, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 18 days.

(21) Appl. No.: 11/423,228

(22) Filed: Jun. 9, 2006

(65) Prior Publication Data

US 2007/0296466 A1    Dec. 27, 2007

(51) Int. Cl.
*H03L 7/089* (2006.01)
*G01R 25/00* (2006.01)

(52) U.S. Cl. .............................. 331/25; 331/1 A; 327/2; 327/12

(58) Field of Classification Search ................. 331/1 A, 331/25; 327/218, 3, 12, 2
See application file for complete search history.

(56) References Cited

U.S. PATENT DOCUMENTS

| | | | | |
|---|---|---|---|---|
| 4,458,199 A | * | 7/1984 | Evans et al. ................. | 323/286 |
| 4,519,086 A | * | 5/1985 | Hull et al. ................... | 375/376 |
| 4,857,866 A | * | 8/1989 | Tateishi ...................... | 331/1 A |
| 5,661,419 A | * | 8/1997 | Bhagwan ....................... | 327/8 |
| 6,157,263 A | * | 12/2000 | Lee et al. ..................... | 331/25 |
| 6,690,209 B1 | * | 2/2004 | Cyrusian ..................... | 327/12 |
| 7,053,666 B2 | * | 5/2006 | Tak et al. ...................... | 327/3 |
| 7,057,432 B2 | * | 6/2006 | Yoo et al. .................... | 327/158 |
| 7,227,386 B2 | * | 6/2007 | Chen ........................... | 327/12 |

\* cited by examiner

*Primary Examiner*—Robert Pascal
*Assistant Examiner*—Levi Gannon
(74) *Attorney, Agent, or Firm*—Martine Penilla & Gencarella, LLP

(57) ABSTRACT

A method for comparing phases of two signals including placing a first output node in a floating state, detecting a first edge of a first signal on a first input node after placing the first output node in the floating state, coupling the first edge of the first signal to the first output node and resetting the first output node to the floating state after coupling the first edge of the first signal to the first output node. A system for comparing phases of two signals can also be included.

18 Claims, 10 Drawing Sheets

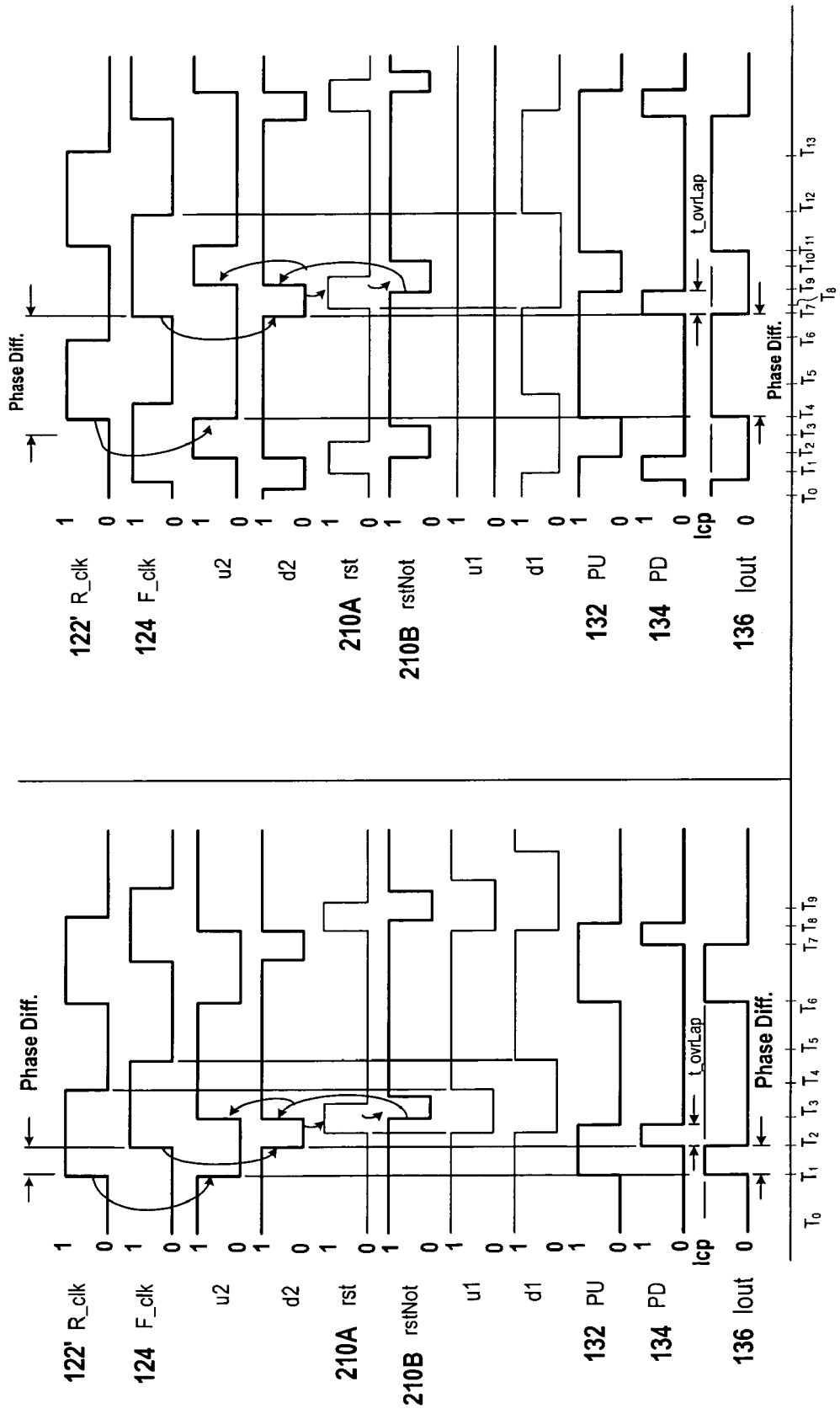

SYSTEM AND METHOD FOR PRE-CHARGED LINEAR PHASE-FREQUENCY DETECTOR

BACKGROUND

The present invention relates generally to phase-locked loop (PLL) circuits, and more particularly, to methods and systems for detecting the phase-frequency in a PLL circuit.

Phase-Frequency detectors are commonly used in phase-locked loop (PLL) circuits. PLL's are often used as part of input/output (I/O) portions microprocessors and in clock signal generating circuits. FIG. 1A is a schematic diagram of a typical PLL circuit 100 used in frequency synthesis. The PLL includes a phase-frequency detector (PFD) 102, a charge-pump 104, a loop filter 106, a voltage-controlled oscillator (VCO) 108 and a frequency divider 110. The function of each of these components is described as follows.

The PFD 102 detects a phase difference between the edges of a reference clock 122 and a second signal (e.g., a feedback clock) 124. The PFD 102 produces two output signals: a pump-up signal 132 and a pump-down signal 134. The width of the pump-up signal 132 and pump-down signal 134 is proportional to a detected phase difference between the reference clock 122 and the feedback clock 124. A PFD 102 can also be used in any other circuit where the phases of two signals are compared to produce one or more output signals proportional to the phase difference of the input signals.

The charge-pump 104 responds to the pump-up signal 132 and pump-down signal 134 output by the PFD 102 to deliver a net amount of charge to the loop filter 106 proportional to the phase difference between the reference clock 122 and the feedback clock 124. The loop filter 106 converts the current 136 delivered by the charge-pump 104 into a loop filter voltage 142. The loop filter voltage 142 is then applied to the VCO 108 to adjust or tune the frequency of the VCO clock output signal 152. The VCO 108 varies its frequency of oscillation in response to the loop filter voltage 142. The VCO 108 typically uses a transfer function in Hertz/Volt to produce a VCO clock output signal 152 with a frequency corresponding to the loop filter voltage 142.

The frequency divider 110 divides the frequency of VCO clock output signal 152 by a selected division ratio (N). The resulting frequency of the signal 124 output by the frequency divider 110 is 1/N of the frequency of the VCO output signal 152. If the PLL 100 is locked on a selected frequency of the VCO clock output signal 152, the frequency of feedback clock 124 is equal to that of the reference clock 122. The phase of the feedback clock 124 is also coincidental with the phase of the reference clock 122. It can also be said that the PLL 100 multiplies the frequency of the reference clock 122 by a factor of N.

Unfortunately VCOs typically produce a significant portion of jitter. Jitter is defined as slight shifts in phase of the VCO clock output signal 152. The frequency of operation of microprocessors is ever increasing over time. By way of example, some I/O circuits have 4 Gbps cycle rates and in the future will be 8 Gbps and even faster. This requires clocks of higher and higher frequencies or clocks cycles of corresponding shorter periods. The amount of jitter that the microprocessor can tolerate in the shorter duration clocks is smaller for shorter clock periods. Acceptable jitter is normally specified in unit intervals or UI that is a fraction of the clock period. Restated, even if the jitter specification is unchanged (i.e., the same UI) the absolute amount of time allotted for jitter will be actually be reduced for clocks with shorter periods. Therefore there is a need for systems and methods for reducing jitter in the VCO clock output signal 152.

SUMMARY

Broadly speaking, the present invention fills these needs by providing systems and methods for reducing clock jitter. It should be appreciated that the present invention can be implemented in numerous ways, including as a process, an apparatus, a system, computer readable media, or a device. Several inventive embodiments of the present invention are described below.

One embodiment provides a method for comparing phases of two signals including placing a first output node in a floating state, detecting a first edge of a first signal on a first input node after placing the first output node in the floating state, coupling the first edge of the first signal to the first output node and resetting the first output node to the floating state after coupling the first edge of the first signal to the first output node.

The floating state of the first output node can include deactivating a current source connected to the first output node and deactivating a current sink connected to the first output node. The current sink can be deactivating at the same time or before the current source is deactivating.

Resetting the first output node to the floating state after coupling the first edge of the first signal to the first output node can include resetting the first output node to the floating state after a sufficient time delay for the first output node to achieve a voltage corresponding to the first edge of the first signal.

The method can also include placing a second output node in a floating state, detecting a first edge of a second signal on a second input node after placing the second output node in the floating state, coupling the first edge of the second signal to the second output node and resetting the second output node to the floating state after coupling the first edge of the second signal to the second output node.

Resetting the first output node to the floating state after coupling the first edge of the first signal to the first output node and resetting the second output node to the floating state after coupling the first edge of the second signal to the second output node can include resetting the first output node and the second output node to the floating state after a sufficient time delay for the first output node and the second output node to achieve an equal signal level. The first output node and the second output node can achieve an equal signal level for a time duration substantially equal to a phase difference between the first input signal and the second input signal.

The first signal can be a reference signal and the second signal can be a feedback signal. The second signal can be a feedback signal from a voltage controlled oscillator.

Another embodiment provides a circuit for comparing phases of two signals. The circuit includes a first input circuit including a first input node, a first output node coupled to the first input node through a first input semiconductor switch, a current source coupled to the first output node through a first source semiconductor switch, and a current sink coupled in series with the first input semiconductor switch through a first sink semiconductor switch. The circuit also includes a first reset circuit having a first input coupled to the first output node and an output coupled to the first sink semiconductor switch and a second reset circuit having an input coupled to the first output node and the second reset circuit includes an output coupled to the to the first source semiconductor switch, the first reset circuit and the second reset circuit capable of placing the first output node in a floating state.

The first reset circuit can be capable of deactivating the first source semiconductor switch, wherein the first sink semiconductor switch is deactivated at substantially the same time or before the first source semiconductor switch is deactivated. The input of the second reset circuit can be coupled to the output of the first reset circuit.

The circuit can also include a second input circuit including a second input node, a second output node coupled to the second input node through a second input semiconductor switch, the current source coupled to the second output node through a second source semiconductor switch and the current sink coupled in series with the second input semiconductor switch through a second sink semiconductor switch.

The first reset circuit can include a second input coupled to the second output node and a second output of the first reset switch is coupled to the second sink semiconductor switch and wherein the output of the second reset circuit is coupled to the to the second source semiconductor switch, the first reset circuit and the second reset circuit capable of placing the second output node in a floating state.

The first reset circuit can include a second input coupled to the second output node and the output of the first reset switch is coupled to the second sink semiconductor switch and wherein the output of the second reset circuit is coupled to the to the second source semiconductor switch, the first reset circuit and the second reset circuit capable of placing the second output node in a floating state.

The first reset circuit can include a second input coupled to the second output node and the output of the first reset circuit is coupled to the second sink semiconductor switch, the second reset circuit capable of deactivating the second sink semiconductor switch and wherein the output of the second reset circuit output is coupled to the second source semiconductor switch, the second reset circuit capable of deactivating the second source semiconductor switch, wherein the first sink semiconductor switch and the second sink semiconductor switch are deactivated at substantially the same time or before the first source semiconductor switch and the second source semiconductor switch are deactivated.

The first signal can be a reference signal and the second signal can be a feedback signal. The second signal can be a feedback signal from a voltage controlled oscillator. The first reset circuit can be capable of deactivating the first source semiconductor switch, wherein the first sink semiconductor switch is deactivated at substantially the same time or before the first source semiconductor switch is deactivated.

Yet another embodiment provides a circuit for comparing phases of two signals. The circuit includes a first input circuit including a first input node, a first output node coupled to the first input node through a first input semiconductor switch, a current source coupled to the first output node through a first source semiconductor switch and a current sink coupled in series with the first input semiconductor switch through a first sink semiconductor switch. The circuit also includes a second input circuit including a second input node a second output node coupled to the second input node through a second input semiconductor switch, the current source coupled to the second output node through a second source semiconductor switch and the current sink coupled in series with the second input semiconductor switch through a second sink semiconductor switch. The circuit also includes a first reset circuit having a first input coupled to the first output node and an output coupled to the first sink semiconductor switch and a second reset circuit having an input coupled to the first output node and the second reset circuit includes an output coupled to the to the first source semiconductor switch, the first reset circuit and the second reset circuit capable of placing the first output node in a floating state, wherein the first reset circuit includes a second input coupled to the second output node and the output of the first reset circuit is coupled to the second sink semiconductor switch, the second reset circuit capable of deactivating the second sink semiconductor switch and wherein the output of the second reset circuit output is coupled to the second source semiconductor switch, the second reset circuit capable of deactivating the second source semiconductor switch, wherein the first sink semiconductor switch and the second sink semiconductor switch are deactivated at substantially the same time or before the first source semiconductor switch and the second source semiconductor switch are deactivated.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIGS. 5A and 5B are graphical representations of the corresponding waveforms compared to time for the reference clock leading the feedback clock in a PFD, in accordance with various embodiments of the present invention.

DETAILED DESCRIPTION

Figure 1A:
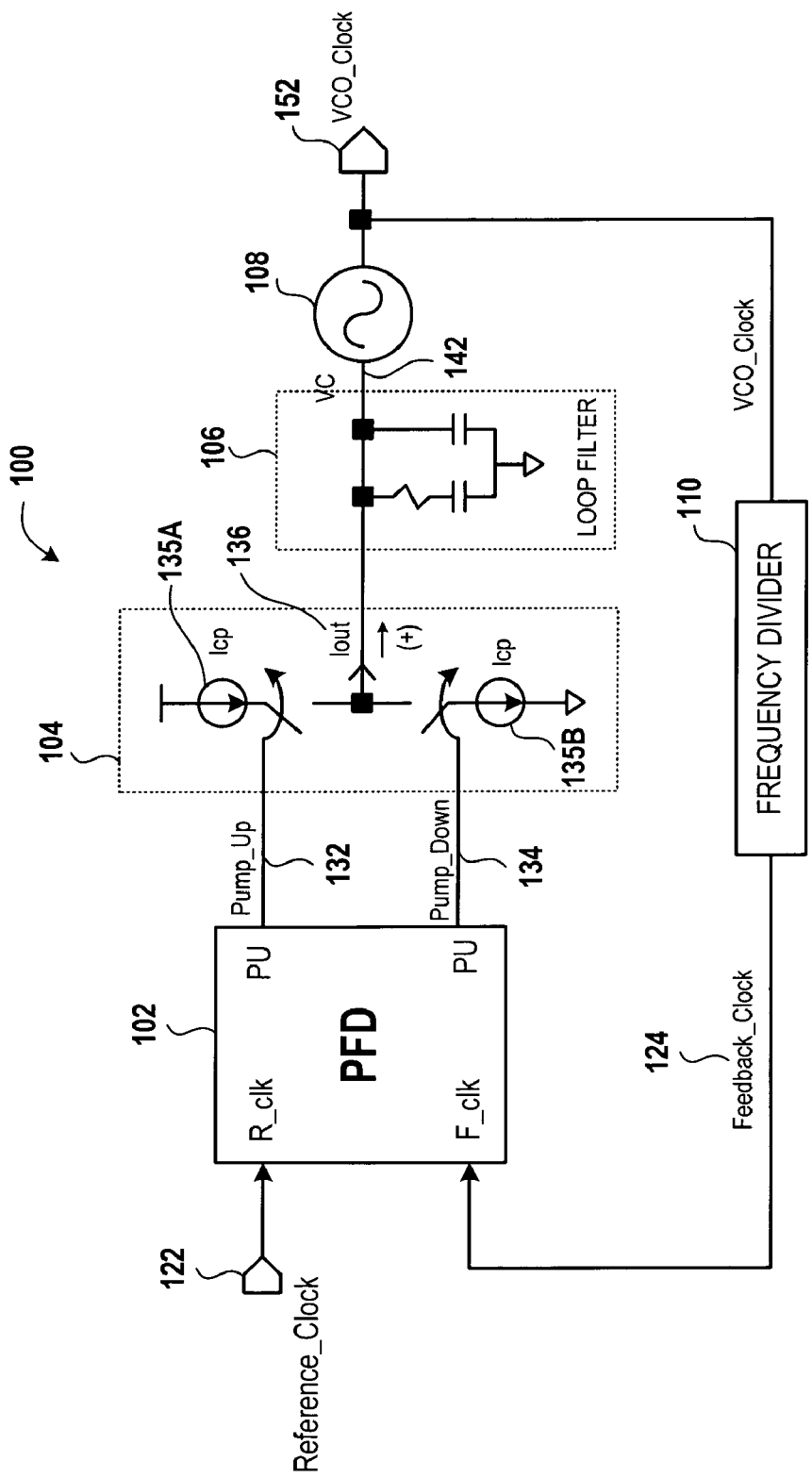
FIG. 1A is a schematic diagram of a typical PLL circuit used in frequency synthesis.

Several exemplary embodiments for systems and methods for reducing clock jitter will now be described. It will be apparent to those skilled in the art that the present invention may be practiced without some or all of the specific details set forth herein.

One embodiment uses a higher frequency reference clock 122' to reduce jitter in the VCO clock output signal 152. The higher frequency of the reference clock 122' is limited only by the highest frequency that the PLL circuit can tolerate. In addition to reducing jitter, the higher frequency reference clock 122' also provides a higher frequency refresh rate of the PLL, improved noise filtering and a simpler frequency divider.

The PLL will have a higher frequency refresh rate because the PLL will be refreshed or updated at the same higher frequency of the reference clock 122'. As a result, the corrections are applied to the PLL circuit more often.

The noise filtering is improved because the PLL acts as a low-pass filter to filter out phase noise and the jitter resulting therefrom that may be a result of the reference clock 122. Therefore, for a given bandwidth, the noise produced by a higher frequency reference clock 122' will be better filtered by the low-pass filter action of the PLL.

The frequency divider 110 can be simpler because the PLL 100 performs a simpler frequency multiplication with a higher frequency reference clock 122'. More specifically, once the PLL 100 is locked on a frequency, the frequency of the VCO clock 152 is N times the frequency of the reference clock 122', where N is the division ratio of the divider 110. Therefore, for a selected output frequency of the VCO clock 152 the division ratio N of the divider 110 will be smaller for a higher frequency reference clock 122' than for a typical frequency reference clock 122. By way of example if a desired output frequency of the VCO clock 152 is 10 GHz, and the reference clock 122 is 1 GHz, then N must be equal to 10 to achieve the output frequency of 10 GHz. Alternatively, if the higher frequency reference clock 122' is 5 GHz, then N must only be equal to 2 to achieve the output frequency of 10 GHz. A lower division ratio (N) requires a simpler frequency divider 110 than a higher division ratio. The simpler frequency divider 110 can require fewer components. Therefore, the simpler frequency divider 110 can be smaller, more reliable and consume less power.

Noise injected at the VCO causes phase shifts in the VCO clock output 152. A loop with a higher bandwidth will correct for such phase shifts more quickly than a loop with smaller bandwidth. Filtering is achieved for the same bandwidth but if the amount of filtering was already acceptable for the lower frequency reference clock 122 then by increasing the frequency of the reference clock to the higher frequency reference clock 122' the frequency of the noise injection caused by the reference clock also increases, therefore the loop bandwidth can be increased without compromising the filtering action on the injection while at the same time making the loop more agile to clean VCO noise. As a result, the overall causes of jitter within the VCO are reduced. Further bandwidth increase is possible given the fact that phase degradation in the loop caused by the delay through the divider is smaller for a given bandwidth, due to the smaller division ratio. As a result, the same phase margin could be achieved at a higher bandwidth.

Figure 1B:
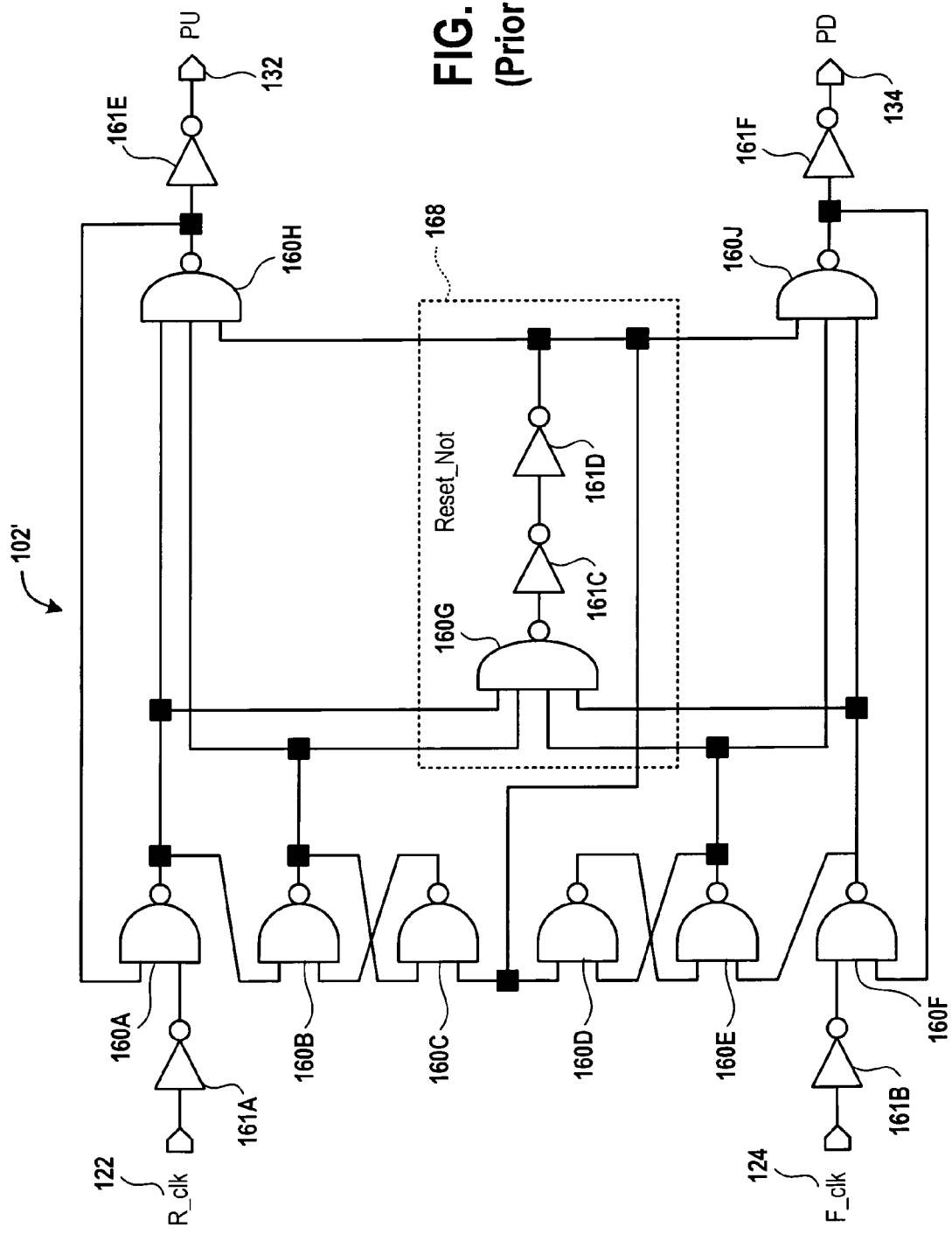
FIGS. 1B and 1C are schematic diagrams of two of the most common topologies of linear PFDs that can be used to perform the function of the PFD.
Figure 1C:
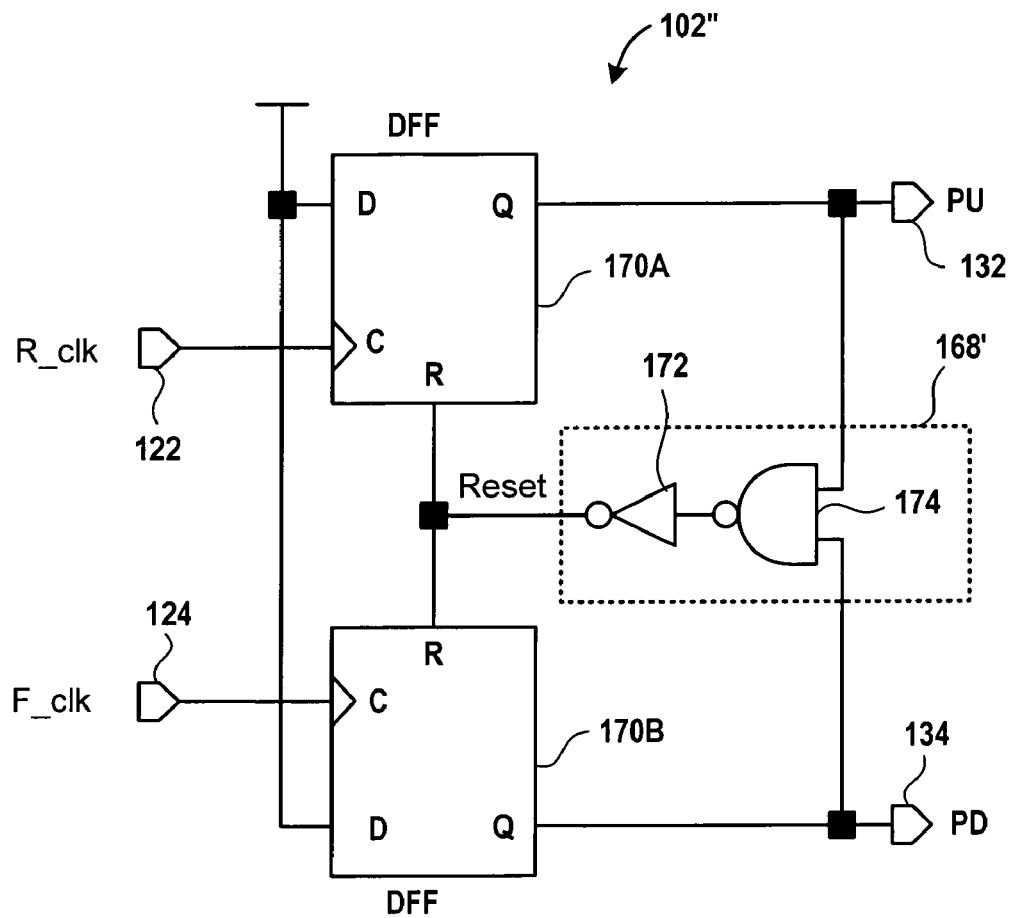

FIGS. 1B and 1C are schematic diagrams of two of the most common topologies of linear PFDs 102' and 102" that can be used to perform the function of the PFD 102. The PFD 102' in FIG. 1B is based on nand gates 160A-160J and inverters 161A-161F with reset 168. The PFD 102" in FIG. 1C is based on D flip-flops 170A and 170B, inverter 172, nand gate 174, with reset 168'.

Figure 1E:
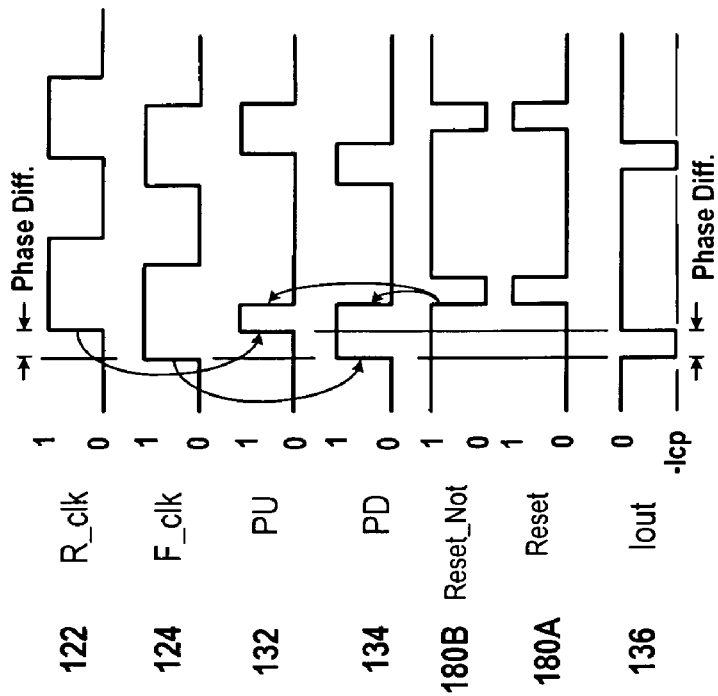
FIGS. 1D and 1E are graphical representations of the corresponding waveforms for the reference clock leading the feedback clock in a PFD.
Figure 1D:
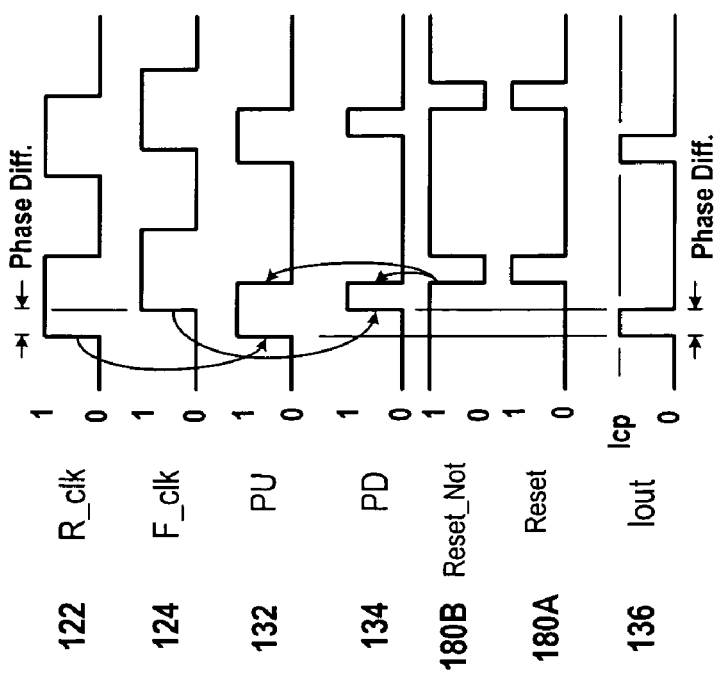

FIGS. 1D and 1E are graphical representations of the corresponding waveforms for the reference clock 122 leading the feedback clock 124 in a PFD. The rising edge of the reference clock 122 initiates the pump-up output 132 and the rising edge of the feedback clock 124 initiates the rising edge of the pump-down output 134. The reset signal 180A (and/or reset_not signal 180B) are initiated at a time delay after both the reference clock 122 and the feedback clock 124 are high. The reset signal (and/or reset_not signal 180B) reset the pump-up output 132 and the pump-down output 134. Referring now to FIG. 1D, if the rising edge of the reference clock 122 leads the rising edge of the feedback clock 124, then the pulse width of the pump up signal 132 is wider than the pulse width of the pump down signal 134 resulting in a net pump-up shown as the I-out signal 136. Referring now to FIG. 1E, if the rising edge of the feedback clock 124 leads the rising edge of the reference clock 122, then the pulse width of the pump down signal 134 is wider than the pulse width of the pump up signal 132 resulting in a net pump-down shown as the I-out signal 136. If the rising edge of the feedback clock 124 and the rising edge of the reference clock 122 occur simultaneously, then the pulse width of the pump down signal 134 is the same as the pulse width of the pump up signal 132 resulting in a zero net pump-up or pump-down (i.e., I-out signal 136=0).

Referring now to FIGS. 1A, 1D and 1E, the I-out signal 136 is produced by the charge-pump 104 in response to the pump up signal 132 and the pump down signal 134. More specifically, the pump up signal 132 causes the current to be sourced by the current source 135A. The current provided by the current source 135A is applied to the loop filter 106, if the current sink 135B is not sinking the current (i.e., current sink 135B is disabled because pump-down signal 134 is not applied to the current sink 135B). The current provided by the current source 135A is applied to the current sink 135B when the pump-down signal 134 is applied to the current sink 135B. Similarly, the current sink 135B sinks current from the loop filter 106, unless the current source 135A is enabled (i.e., when pump up signal 132 enables the current source 135A. Sourcing current to or sinking current from the loop filter 106 increases or decreases the voltage on the VCO 108, which correspondingly varies the frequency of the VCO.

Figure 2:
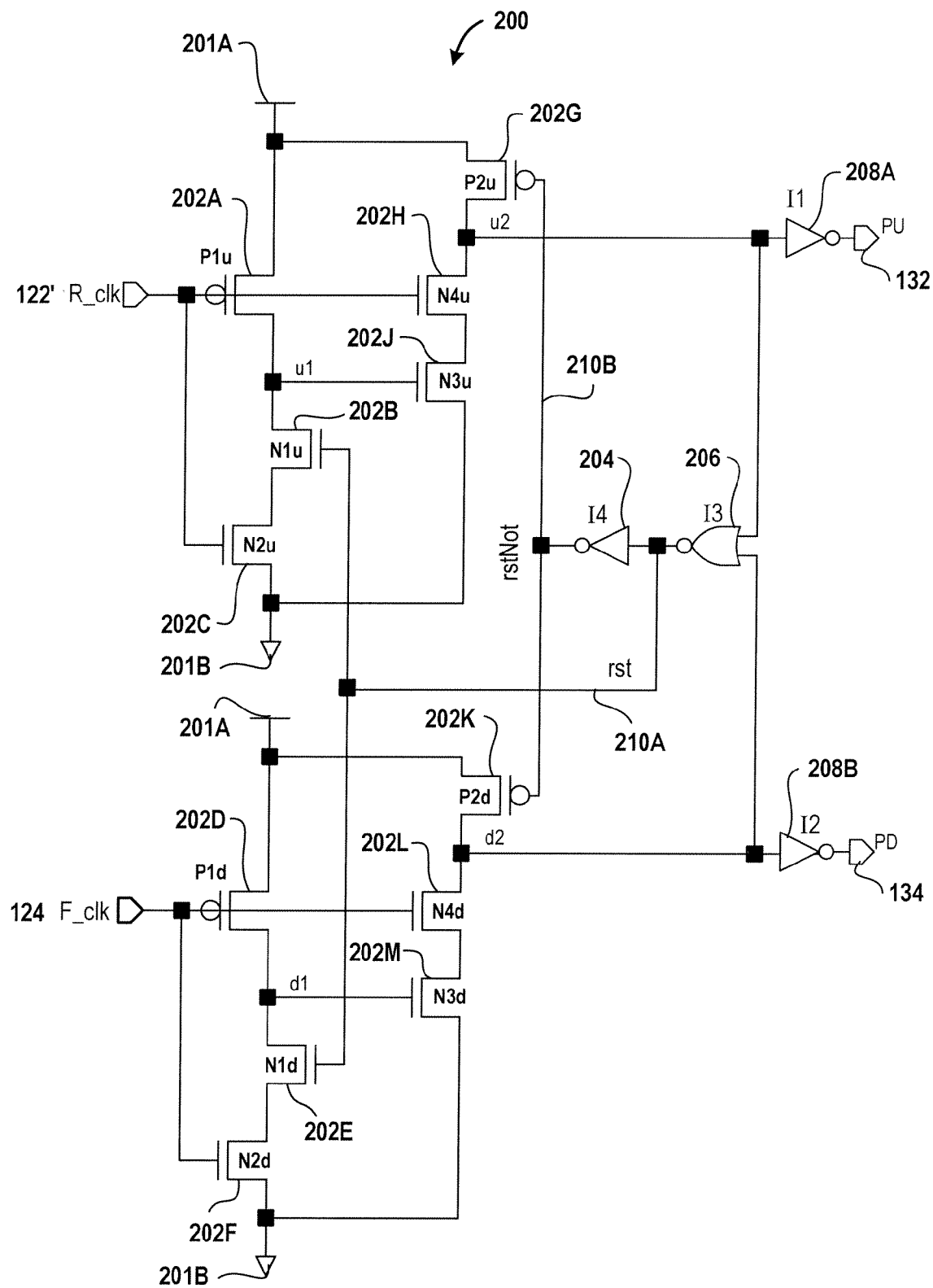
FIG. 2 is a schematic diagram of an improved PFD, in accordance with an embodiment of the present invention.
Figure 3A:
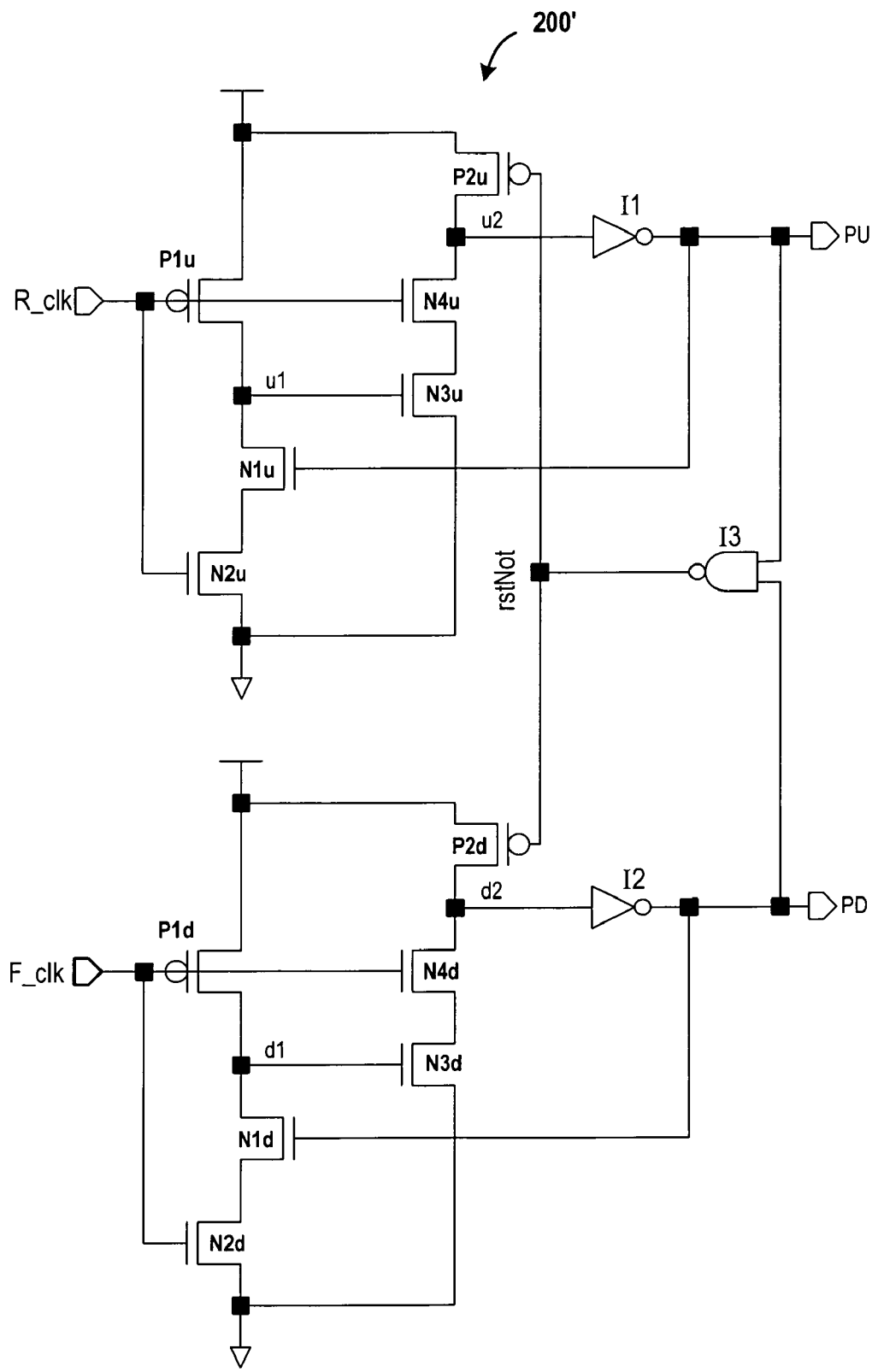
FIGS. 3A-C are schematic diagrams of PFDs in accordance with additional embodiments of the present invention.
Figure 3B:
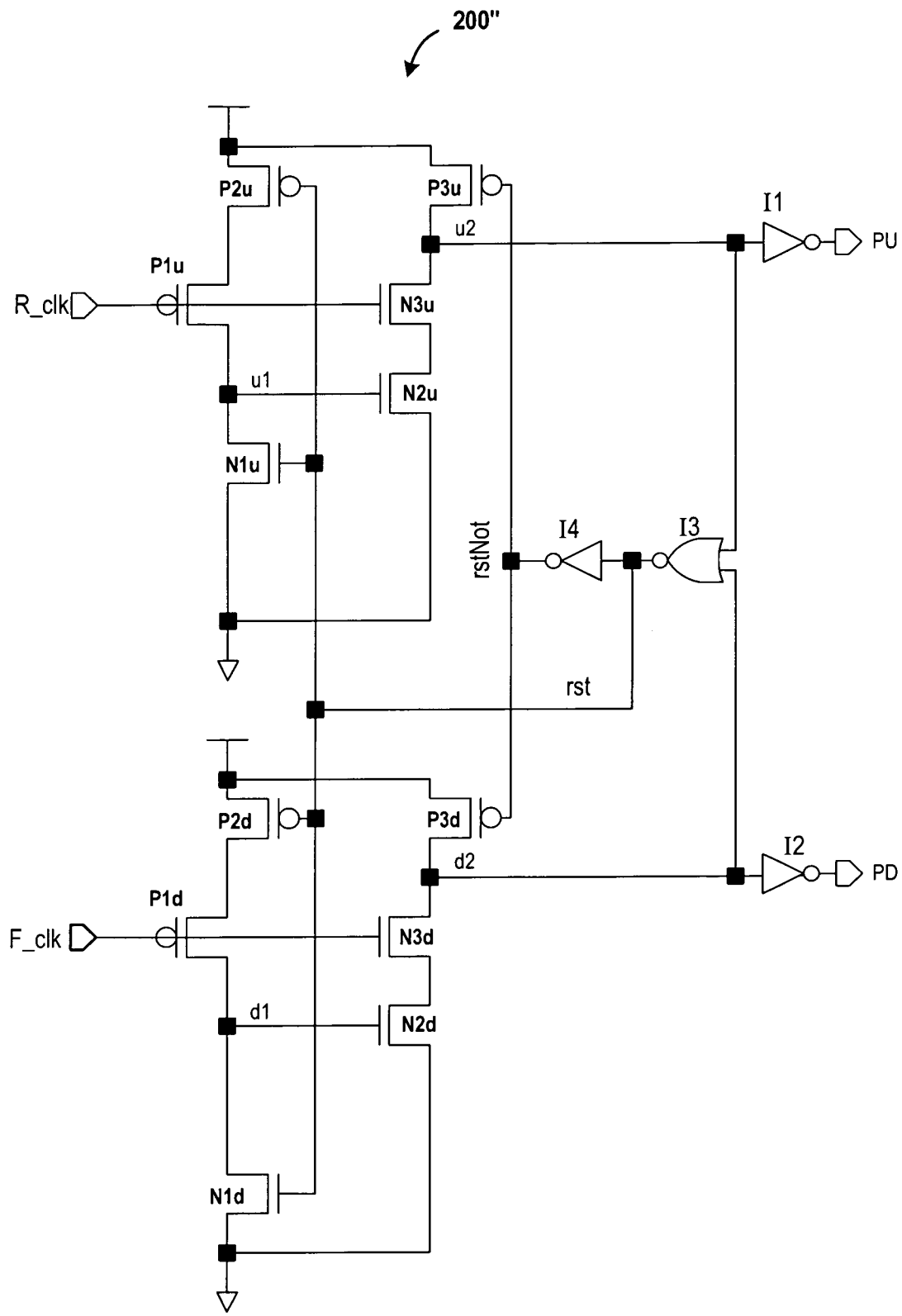
Figure 3C:
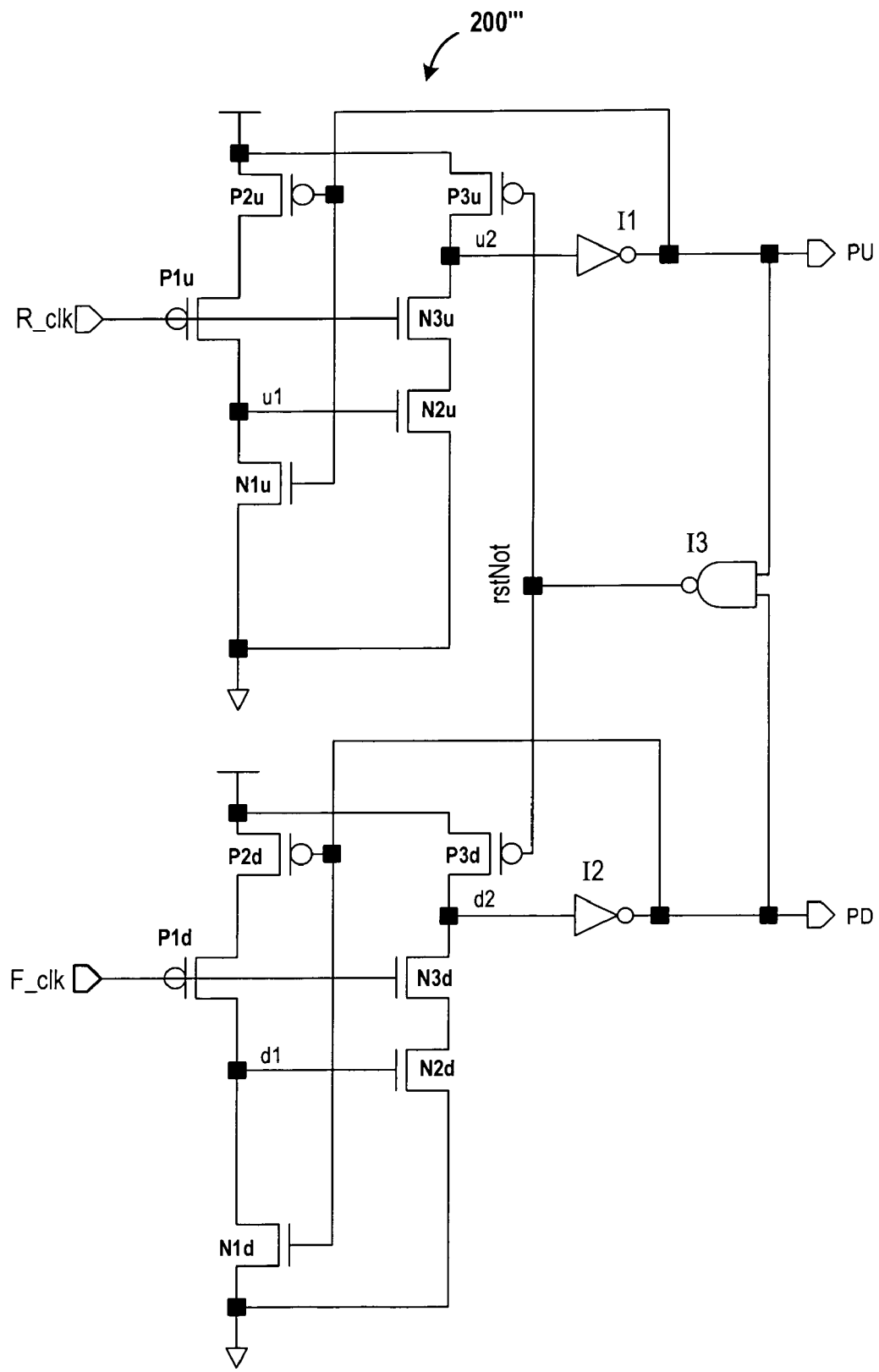

FIG. 2 is a schematic diagram of an improved PFD 200, in accordance with an embodiment of the present invention. One of the limits imposed on the maximum frequency of the reference clock 122' is the circuit structure and operation of the typical PFD 102 shown in FIG. 1A above. The improved PFD 200 provides a maximum frequency of operation that is substantially higher than the frequency of operation of the traditional PFD 102. The improved PFD 200 enables the use of the higher frequency reference clock 122'. The improved PFD 200 is pre-charged to enable the use of the higher frequency reference clock 122'. The pre-charged PFD 200 has a fast response time. FIGS. 3A-C are schematic diagrams of PFDs 200', 200" and 200''' in accordance with additional embodiments of the present invention.

The pre-charged PFDs 200-200''' are faster because the nodes u1, u2, d1 and d2 are pre-charged. When the nodes u1, u2, d1 and d2 are pulled-down or pulled-up (depending on their respective polarity and type of device e.g., PMOS/NMOS), a respective input transistor will drive each of the nodes in the respective pulled-up or pulled-down state. Before the state of each of the nodes u1, u2, d1 and d2 can be changed, the respective input transistor must first be disabled. If the respective input transistor is not first disabled, then the input transistor will initially fight switching the state of the respective nodes. As a result, if driven too fast, an excess (or bleeding) current can be produced in a transitional state of the input as in traditional CMOS logic. This bleeding current can cause jitter in the VCO clock output signal 152.

By way of example, in a typical inverter including a PMOS transistor and a NMOS transistor, both PMOS and NMOS transistors conduct when the input passes through a middle value. When both the PMOS and NMOS transistors conduct, a current spikes results due to the current passing from supply to ground during that time.

Referring again to the pre-charged PFDs 200-200''', to reduce the fighting the changing of the states of the nodes u1, u2, d1 and d2, each one of the respective input transistors are disabled before the state of the nodes are switched. As a result, the nodes u1, u2, d1 and d2 are temporarily placed in a floating state before trying to switch their respective states. The nodes u1, u2, d1 and d2 can temporarily store their last set value in their respective parasitic capacitance until their respective input transistors instruct them to change their state.

Figure 4:
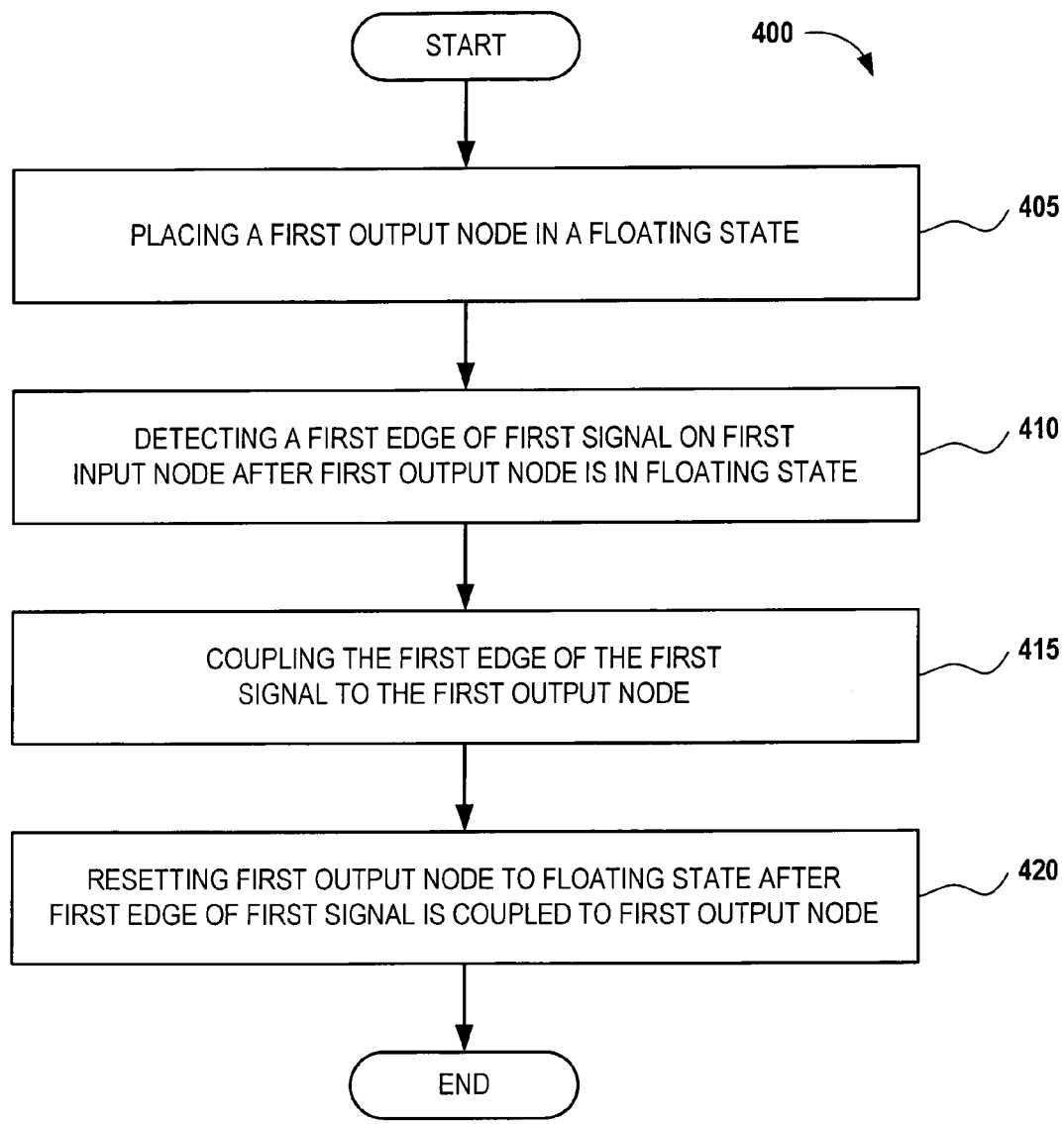
FIG. 4 is a flowchart of the method operations performed by the PFDs, in accordance with an embodiment of the present invention.

FIG. 4 is a flowchart of the method operations 400 performed by the PFDs 200-200''', in accordance with an embodiment of the present invention. FIGS. 5A and 5B are graphical representations of the corresponding waveforms compared to time for the reference clock 122 leading the feedback clock 124 in a PFD 200-200''', in accordance with various embodiments of the present invention. FIG. 5A illustrates the states of the various nod in the PFD 200-200''' in a pump-up condition. FIG. 5B illustrates the states of the various nodes in the PFD 200-200''' in a pump-down condition. Referring now to FIGS. 2, 4 and 5A, the rising edge of the reference clock 122' leads the rising edge of the feedback clock 124. Starting with the reset signal 210A in a low state, which disables (stops conducting) current sinking semiconductor switch NMOS 202B and thereby allowing an easy pull-up of first input node u1 by input semiconductor switch PMOS 202A. Since the reset signal 210A is in a low state, then reset_not 210B is in a high state, which disables PMOS 202G and thereby allowing first output node u2 to float because the current source semiconductor switch PMOS 202G no longer couples the applied current source 201A to the first output node u2. The rising edge of the reference clock 122' enables (e.g., starts conducting) current sinking semiconductor switch NMOS 202H, which pulls first output node u2 low. The rising edge of the reference clock 122' also enables current sinking semiconductor switch NMOS 202C and disables input semiconductor switch PMOS 202A. First output node u2 is low because current sinking semiconductor switches NMOS 202H and NMOS 202J are sinking any current available at first output node u2 to ground (e.g., series coupled current sinking semiconductor switches NMOS 202H and NMOS 202J are a current sink for first output node u2 by coupling first output node u2 to ground 201B). An inverter 208A inverts the low state of the first output node u2 to produce a high pump-up signal 132.

Starting with the reset signal 210A in a low state, which disables current sinking semiconductor switch NMOS 202E and thereby allowing an easy pull-up of second input node d1 by input semiconductor switch PMOS 202D. Since the reset signal 210A is in a low state, then reset_not 210B is in a high state, which disables current source semiconductor switch PMOS 202K causing the applied current source 201A to no longer be coupled across current source semiconductor switch PMOS 202K to the second output node d2 and thereby allowing the second output node d2 to float. The rising edge of the feedback clock 124 enables current sinking semiconductor switch NMOS 202L, which pulls the second node d2 low. The rising edge of the feedback clock 124 also enables current sinking semiconductor switch NMOS 202F and disables input semiconductor switch PMOS 202D. The second node d2 is low because current sinking semiconductor switches NMOS 202L and NMOS 202M are sinking any current available at the second output node d2 by coupling output node d2 to ground 201B. An inverter 208B inverts the low state of the second output node d2 to produce a high pump-down signal 134.

In an operation 405 of FIG. 4, a first output node (e.g., node u2 or d2) is placed in a floating state. Node u2 can be placed in a floating state by disabling the current sinking through NMOS 202H and/or NMOS 202J. Similarly, node d2 can be placed in a floating state by disabling the current sinking through NMOS 202L and/or NMOS 202M.

Referring again to FIGS. 2 and 5A, the NOR gate 206 produces a reset signal 210A. The inverter 204 inverts the reset signal 210A to produce a reset_not signal 210B. The reset signal 210A is high only when both of output nodes u2 and d2 are low. Conversely, the reset_not signal 210B is low only when both of output nodes u2 and d2 are low. When both of output nodes u2 and d2 are low (e.g., when a high pump-up signal 132 and a high pump-down signal 134 are being produced), the reset signal 210A is high and enables current sinking semiconductor switches NMOS 202B and NMOS 202E. As a result, current sinking semiconductor switches NMOS 202B and NMOS 202C sink the current to input node u1 by coupling input node u1 to ground 201B and current source semiconductor switches NMOS 202E and NMOS 202F sink the current to input node d1 by coupling input node d1 to ground 201B. As a result input nodes u1 and d1 are driven low. When input nodes u1 and d1 are driven low, then current sinking semiconductor switches NMOS 202J and 202M, respectively are disabled which decouples ground 201B to output nodes u2 and d2 causing output nodes u2 and d2, respectively to begin to float.

A short time delay after the reset signal 210A goes high, the reset_not signal 210B goes low. The low reset_not signal 210B enables current source semiconductor switches PMOS 202G and PMOS 202K. Enabling current source semiconductor switches PMOS 202G and PMOS 202K couples current source 201A to the output nodes u2 and d2 and drives respective output nodes u2 and d2 to a high state. Since the output nodes u2 and d2 were floating before the current source semiconductor switches PMOS 202G and PMOS 202K were enabled, then the current source semiconductor switches PMOS 202G and PMOS 202K were required to provide less current to drive the respective output nodes u2 and d2 to the high state. When the output nodes u2 and d2 are at a high state, the respective pump-up signal 132 and pump-down signal 134 go to a low state.

As the output nodes u2 and d2 are at a high state and the next incoming rising edges of the reference clock 122' and the feedback clock 124 are due, it would be beneficial to have the output nodes u2 and d2 in a floating state before the rising edges of the reference clock 122' and the feedback clock 124 arrive at the inputs.

As the output nodes u2 and d2 are at a high state, the reset signal 210A switches to a low state, which disables current sinking semiconductor switches NMOS 202B and NMOS 202E. When current sinking semiconductor switches NMOS 202B and NMOS 202E are disabled, then nodes u1 and d1 are left floating waiting to be pulled up when the reference clock 122' and the feedback clock 124 go to a low state. Input nodes u1 and d1 are pulled high in preparation for when the reference clock 122' and the feedback clock 124 go to a high state. The reset signal 210A switching to a low state also causes the reset_not signal 210B to switch to a high state. The reset_not signal 210B high state disables current source semiconductor switches PMOS 202G and PMOS 202K causing output nodes u2 and d2 to float.

Referring again to FIG. 4, in an operation 410, a first edge of the first signal is detected on a first input node at a time after the first output node is placed in the floating state. As described above, the output nodes u2 and d2 are placed in a floating state shortly after causing the respective pump-up signal 132 and pump-down signal 134 to go to a low state.

In an operation 415, the first edge of the first signal is coupled to the first output node as described above. In an operation 420, the first output node is reset to the floating state after the first edge of the first signal is coupled to the first output node.

FIGS. 5A and 5B are graphical representation of the waveforms of the pre-charged PFDs 200-200''' of FIG. 4, in accordance with an embodiment of the present invention. FIGS. 5A and 5B illustrate the cases where, (a) reset 210A and reset-not 210B occur during reference clock 122' high and (b) reset 210A and reset_not 210B occur when reference clock 122' is low. The time when the pump-up signal 132 and the pump-down signal 134 overlap (t_ovrLap) is equal to the sum of the several propagation delays as follows, $$t\_ovrLap = tpd\_I3 + tpd\_I4 + tpd\_P2u$$

$$t\_ovrLap = tpd\_I3 + tpd\_I4 + tpd\_P2d$$

where tpd_*=propagation delay of * instance or device.

For the proposed PFD to operate properly two conditions must be met,

1. Fall-time of u2<tpd_I3+tpd_N1u.
Fall-time of d2<tpd_I3+tpd_N1d.
2. tpd_N1u<tpd_I4.
tpd_N1d<tpd_I4.

Condition 1 will ensure that output nodes u2 and d2 are fully discharged by the rising of the respective reference clock 122' and feedback clock 124 before input nodes u1 and d1 are discharged by the rising of reset signal 210A. The last output node, either u2 or d2, that was the last to go to a low state will trigger the reset signal 210A to go to a high state.

Condition 2 will ensure that output nodes u1 and d1 are fully discharged by the reset signal 210A going high before PMOS 202G and PMOS 202K, respectively, are commanded to pull-up by the reset_not signal 210B going to a low state. Otherwise if the respective reference clock 122' and/or the feedback clock 124 is high NMOS 202J and NMOS 202M will fight with PMOS 202G and PMOS 202K, respectively, attempting to pull-up the output nodes u2 and d2 at the same time. This conflict would slow down the charging of the output nodes u2 and d2 and produce a spike of current flowing through the PMOS 202G to the NMOS 202H and NMOS 202J to ground and PMOS 202K through NMOS 202L and NMOS 202M to ground.

The proposed pre-charged PFD 200-200''' has a maximum frequency of operation which is substantially higher than that of existing topologies such as those in FIG. 1A. The higher frequency capability will enable the use of a higher frequency reference clock 122'. While not described in detail, the operation of the PFDs 200', 200'' and 200''' shown in FIGS. 3A-3C, respectively, operate in a similar manner to that described above for PFD 200. Specifically, the output nodes of PFDs 200', 200'' and 200''' are allowed to float before being switching states so that they output nodes can switch states more easily, more quickly and more power efficiently.

It should be understood that while NMOS and PMOS devices are described above, NMOS devices and PMOS are merely exemplary devices and that any type of switching circuit device or semiconductor switching device including transistors and other switching devices can be used interchangeably to perform the same functions with respective relatively minor adjustments to voltage polarity and circuit structure.

It will be further appreciated that the instructions represented by the operations in the above FIG. 5 are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for comparing phases of two signals comprising:

placing a first output node in a floating state, the first output node included in a first input circuit also including:

a first output node coupled to the first input node through a first input semiconductor switch;

a current source coupled to the first output node through a first current source semiconductor switch; and a current sink coupled in series with the first input semiconductor switch through a first current sinking semiconductor switch;

detecting a first edge of a first signal on the first input node after placing the first output node in the floating state, wherein the first signal charges the first output node to a corresponding charged state including activating a corresponding one of the current source coupled to the first output node or the current sink coupled to the first output node, wherein the current source is selectively coupled to the first output node by the first current source semiconductor switch and wherein the current sink includes at least one first current sinking semiconductor switch selectively coupling a ground potential to the first output node;

coupling the first edge of the first signal to the first output node; and resetting the first output node to the floating state with a corresponding first reset circuit or a second reset circuit after coupling the first edge of the first signal to the first output node;

the first reset circuit having a first input coupled to the first output node and an output coupled to the first current sinking semiconductor switch; and the second reset circuit having an input coupled to the first output node and the second reset circuit includes an output coupled to the first current source semiconductor switch, the first reset circuit and the second reset circuit capable of placing the first output node in a floating state.

2. The method of claim 1, wherein the floating state of the first output node includes:

deactivating the current source semiconductor switch connected to the first output node; and deactivating the current sinking semiconductor switch connected to the first output node.

3. The method of claim 1, wherein resetting the first output node to the floating state after coupling the first edge of the first signal to the first output node includes resetting the first output node to the floating state after a sufficient time delay for the first output node to achieve a voltage corresponding to the first edge of the first signal.

4. The method of claim 1, further comprising:

placing a second output node in a floating state;

detecting a first edge of a second signal on a second input node after placing the second output node in the floating state wherein the second signal charges the second output node to a corresponding charged state including activating a corresponding one of the current source coupled to the second output node or the current sink coupled to the second output node, wherein the current source is selectively coupled to the second output node by a second current source semiconductor switch and wherein the current sink includes at least one second current sinking semiconductor switch selectively coupling the ground potential to the second output node;

coupling the first edge of the second signal to the second output node; and resetting the second output node to the floating state after coupling the first edge of the second signal to the second output node.

5. The method of claim 4, wherein resetting the first output node to the floating state after coupling the first edge of the first signal to the first output node and resetting the second output node to the floating state after coupling the first edge of the second signal to the second output node includes resetting the first output node And the second output node to the floating state after a sufficient time delay for the First output node and the second output node to achieve an equal signal level.

6. The method of claim 5, wherein the first output node and the second output node achieve an equal signal level for a time duration substantially equal to a phase difference between the first input signal and the second input signal.

7. The method of claim 4, wherein the first signal is reference signal and the second signal is a feedback signal.

8. The method of claim 4, wherein the second signal is a feedback signal from a voltage controlled oscillator.

9. A circuit for comparing phase of two signals comprising:
   a first input circuit including:
      a first input node;
      a first output node coupled to the first input node through a first input semiconductor switch;
      a current source coupled to the first output node through a first current source semiconductor switch; and
      a current sink coupled in series with the first input semiconductor switch through a first current sinking semiconductor switch;
   a first reset circuit having a first input coupled to the first output node and an output coupled to the first current sinking semiconductor switch; and
   a second reset circuit includes an input coupled to the first output node and the second reset circuit includes an output coupled to the first current source semiconductor switch, the first reset circuit and the second reset circuit capable of placing the first output node in a floating state.

10. The circuit of claim 9, wherein the input of the second reset circuit is coupled to the output of the first reset circuit.

11. The circuit of claim 9, further comprising:
   a second input circuit including:
      a second input node;
      a second output node coupled to the second input node through a second input semiconductor switch;
      the current source coupled to the second output node through a second current source semiconductor switch; and
      the current sink coupled in series with the second input semiconductor switch through a second current sinking semiconductor switch.

12. The circuit of claim 11, wherein the first reset circuit includes a second input coupled to the second output node and a second output of the first reset circuit is coupled to the second current sinking semiconductor switch; and
   wherein the output of the second reset circuit is coupled to the second current source semiconductor switch, the first reset circuit and the second reset circuit capable of placing the second output node in a floating state.

13. The circuit of claim 11, wherein the first reset circuit includes a second input coupled to the second output node and the output of the first reset circuit is coupled to the second current sinking semiconductor switch; and
   wherein the output of the second reset circuit is coupled to the to the second source semiconductor switch, the first reset circuit and the second reset circuit capable of placing the second output node in a floating state.

14. The circuit of claim 11, wherein the first reset circuit includes a second input coupled to the second output node and the output of the first reset circuit is coupled to the second current sinking semiconductor switch, the second reset circuit capable of deactivating the second current sinking semiconductor switch; and
   wherein the output of the second reset circuit output is coupled to the second current source semiconductor switch, the second reset circuit capable of deactivating the second current source semiconductor switch, wherein the first current sinking semiconductor switch and the second current sinking semiconductor switch are deactivated at substantially the same time or before the first current source semiconductor switch and the second current source semiconductor switch are deactivated.

15. The circuit of claim 11, wherein the first signal is a reference signal and the second signal is a feedback signal.

16. The circuit of claim 11, wherein the second signal is a feedback signal from a voltage controlled oscillator.

17. The circuit of claim 11, wherein the first reset circuit is capable of deactivating the first current source semiconductor switch, wherein the first current sinking semiconductor switch is deactivated at substantially the same time or before the first current source semiconductor switch is deactivated.

18. A circuit for comparing phases of two signals comprising:
   a first input circuit including:
      a first input node;
      a first output node coupled to the first input node through a first input semiconductor switch;
      a current source coupled to the first output node through a first current source semiconductor switch; and
      a current sink coupled in series with the first input semiconductor switch through a first current sinking semiconductor switch;
   a second input circuit including:
      a second input node;
      a second output node coupled to the second input node through a second input semiconductor switch;
      the current source coupled to the second output node through a second current source semiconductor switch; and
      the current sink coupled in series with the second input semiconductor switch through a second current sinking semiconductor switch;
   a first reset circuit having a first input coupled to the first output node and an output coupled to the first current sinking semiconductor switch; and
   a second reset circuit having an input coupled to the first output node and the second reset circuit includes an output coupled to the first current source semiconductor switch, the first reset circuit and the second reset circuit capable of placing the first output node in a floating state;
   wherein the first reset circuit includes a second input coupled to the second output node and the output of the first reset circuit is coupled to the second current sinking semiconductor switch, the second reset circuit capable of deactivating the second current sinking semiconductor switch; and
   wherein the output of the second reset circuit output is coupled to the second current source semiconductor switch, the second reset circuit capable of deactivating the second current source semiconductor switch.

* * * * *